US012796550B2

(12) United States Patent
Kim

(10) Patent No.: US 12,796,550 B2
(45) Date of Patent: Nov. 10, 2026

(54) SEMICONDUCTOR PACKAGE AND METHOD FOR FABRICATING THE SAME

(71) Applicant: Samsung Electronics Co., Ltd., Suwon-si (KR)

(72) Inventor: Kil Soo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 545 days.

(21) Appl. No.: 18/341,490

(22) Filed: Jun. 26, 2023

(65) Prior Publication Data

US 2024/0038727 A1 Feb. 1, 2024

(30) Foreign Application Priority Data

Jul. 26, 2022 (KR) ........................ 10-2022-0092190

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 72/877* (2026.01);
(Continued)

(58) Field of Classification Search
CPC ..... H10B 80/00; H01L 25/0657; H01L 25/50; H01L 21/561; H01L 23/3128;
(Continued)

(56) References Cited

U.S. PATENT DOCUMENTS 7,116,002 B2 10/2006 Chao et al.
7,119,426 B2 10/2006 Fukui et al.
(Continued)

FOREIGN PATENT DOCUMENTS

JP 2012129464 A 7/2012
JP 2014187167 A 10/2014
(Continued)

OTHER PUBLICATIONS

Office Action for Korean Application No. 10-2022-0092190 dated Dec. 8, 2025.

*Primary Examiner* — Timor Karimy
(74) *Attorney, Agent, or Firm* — Harness, Dickey & Pierce, P.L.C.

(57) ABSTRACT

A semiconductor package and method of fabricating the same are provided. The semiconductor package includes a first semiconductor chip including first and second surfaces opposite to each other; connection terminals on the first surface of the first semiconductor chip; a first dielectric layer on the second surface of the first semiconductor chip; a second semiconductor chip on the first dielectric layer and including a third surface opposite to the second surface and a fourth surface opposite to the third surface; a second dielectric layer on the third surface of the second semiconductor chip and in contact with the first dielectric layer; a third semiconductor chip on the fourth surface of the second semiconductor chip; and a first adhesive layer between the second semiconductor chip and the third semiconductor chip, the first dielectric layer and the second dielectric layer including no wirings.

15 Claims, 9 Drawing Sheets

(51) Int. Cl.

| | |
|---|---|
| ***H10W 72/00*** | (2026.01) |
| ***H10W 74/01*** | (2026.01) |
| ***H10W 74/10*** | (2026.01) |
| ***H10W 90/24*** | (2026.01) |
| *H10W 72/30* | (2026.01) |

(52) U.S. Cl.

CPC ........ *H10W 74/014* (2026.01); *H10W 74/117* (2026.01); *H10W 72/072* (2026.01); *H10W 72/073* (2026.01); *H10W 72/07354* (2026.01); *H10W 72/347* (2026.01); *H10W 72/865* (2026.01); *H10W 72/884* (2026.01); *H10W 90/24* (2026.01); *H10W 90/724* (2026.01); *H10W 90/732* (2026.01); *H10W 90/754* (2026.01)

(58) Field of Classification Search

CPC ......... H01L 24/16; H01L 24/32; H01L 24/33; H01L 24/48; H01L 24/73; H01L 24/81; H01L 24/83; H01L 2225/06562; H01L 2224/16227; H01L 2224/32145; H01L 2224/33181; H01L 2224/48227; H01L 2224/73215; H01L 2224/73253; H01L 2224/73265; H01L 2224/81; H01L 2224/83; H10W 90/00; H10W 90/732; H10W 90/724; H10W 90/754; H10W 90/24; H10W 74/014; H10W 74/117; H10W 72/877; H10W 72/884; H10W 72/072; H10W 72/073; H10W 72/347; H10W 72/07354

See application file for complete search history.

(56) References Cited

U.S. PATENT DOCUMENTS

| | | | | |
|---|---|---|---|---|
| 7,485,968 | B2 | 2/2009 | Enquist et al. | |
| 8,399,974 | B1 | 3/2013 | Huneke | |
| 9,331,149 | B2 | 5/2016 | Tong et al. | |
| 9,673,183 | B2 * | 6/2017 | Lim ........................ | H01L 24/06 |
| 10,796,975 | B2 | 10/2020 | Mao | |
| 11,011,500 | B2 | 5/2021 | Vodrahalli et al. | |
| 2019/0035705 | A1 * | 1/2019 | Mao ........................ | H01L 23/18 |
| 2020/0066682 | A1 | 2/2020 | Kim et al. | |

FOREIGN PATENT DOCUMENTS

| | | | |
|---|---|---|---|
| JP | 2019096874 | A | 6/2019 |
| JP | 2019161007 | A | 9/2019 |
| JP | 2022014121 | A | 1/2022 |

* cited by examiner

SEMICONDUCTOR PACKAGE AND METHOD FOR FABRICATING THE SAME

CROSS-REFERENCE TO RELATED APPLICATION

This application claims priority from Korean Patent Application No. 10-2022-0092190 filed on Jul. 26, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor packages and methods of fabricating the same.

2. Description of the Related Art

Recently, the electronic product market has seen a rapidly increasing demand for portable devices, which steadily requires miniaturization and weight reduction of electronic components mounted on the electronic products. To realize the miniaturization and weight reduction of these electronic components requires not only a technology for reducing the individual size of mounted components but also a semiconductor package technology for integrating a plurality of individual devices into a single package. Implementation of the semiconductor package of reduced size is desired.

SUMMARY

Aspects of the present disclosure provide semiconductor packages having a reduced thickness.

Aspects of the present disclosure provide methods capable of manufacturing a semiconductor package having a reduced thickness.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some aspects of the present disclosure, there is provided a semiconductor package including a first semiconductor chip including a first surface and a second surface that are opposite to each other; connection terminals on the first surface of the first semiconductor chip; a first dielectric layer on the second surface of the first semiconductor chip; a second semiconductor chip on the first dielectric layer and including a third surface opposite to the second surface and a fourth surface opposite to the third surface; a second dielectric layer on the third surface of the second semiconductor chip and in contact with the first dielectric layer; a third semiconductor chip on the fourth surface of the second semiconductor chip; and a first adhesive layer between the second semiconductor chip and the third semiconductor chip, the first dielectric layer and the second dielectric layer including no wirings.

According to some aspects of the present disclosure, there is provided a semiconductor package, including a first chip structure including a first semiconductor chip and a first dielectric layer on the first semiconductor chip, the first chip structure having a first width; a second chip structure including a second semiconductor chip and a second dielectric layer on the second semiconductor chip, the second chip structure having a second width greater than the first width; and a molding layer on the second chip structure and surrounding the first chip structure, the first dielectric layer being in contact with the second dielectric layer, and the molding layer having outer walls coplanar with sidewalls of the first chip structure.

According to some aspects of the present disclosure, there is provided a method of fabricating a semiconductor package, the method including forming a first dielectric layer on a first wafer including a plurality of first semiconductor chips; forming a second dielectric layer on a second wafer including a plurality of second semiconductor chips; forming a chip structure by cutting the first wafer and the first dielectric layer; and attaching the chip structure on the second dielectric layer, the second dielectric layer being in contact with the first dielectric layer.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
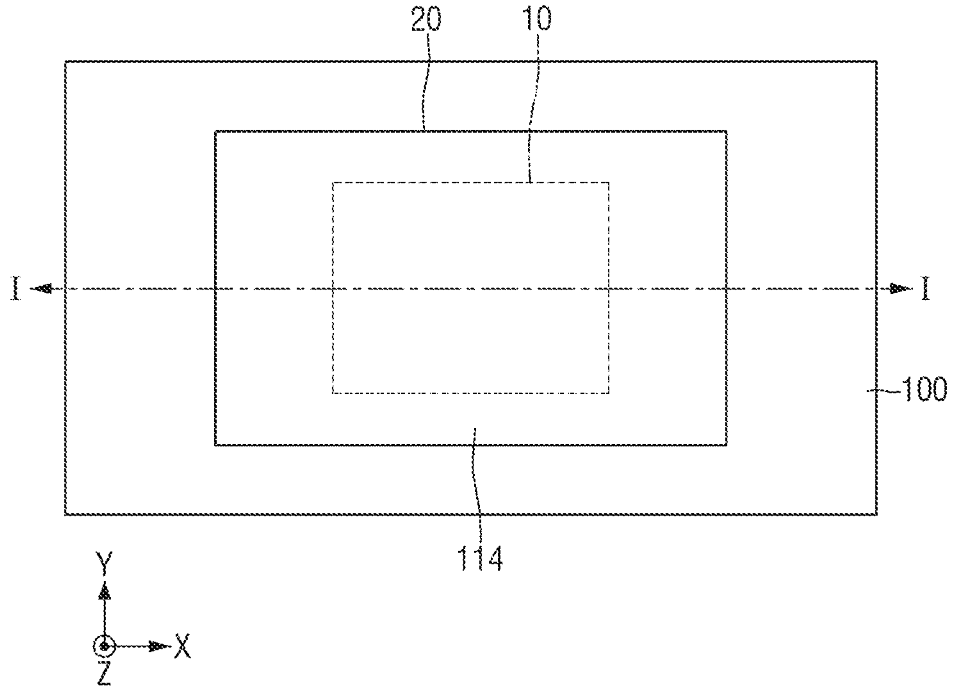
FIG. 1 is a plan view illustrating a semiconductor package according to some example embodiments of the present disclosure.
Figure 2:
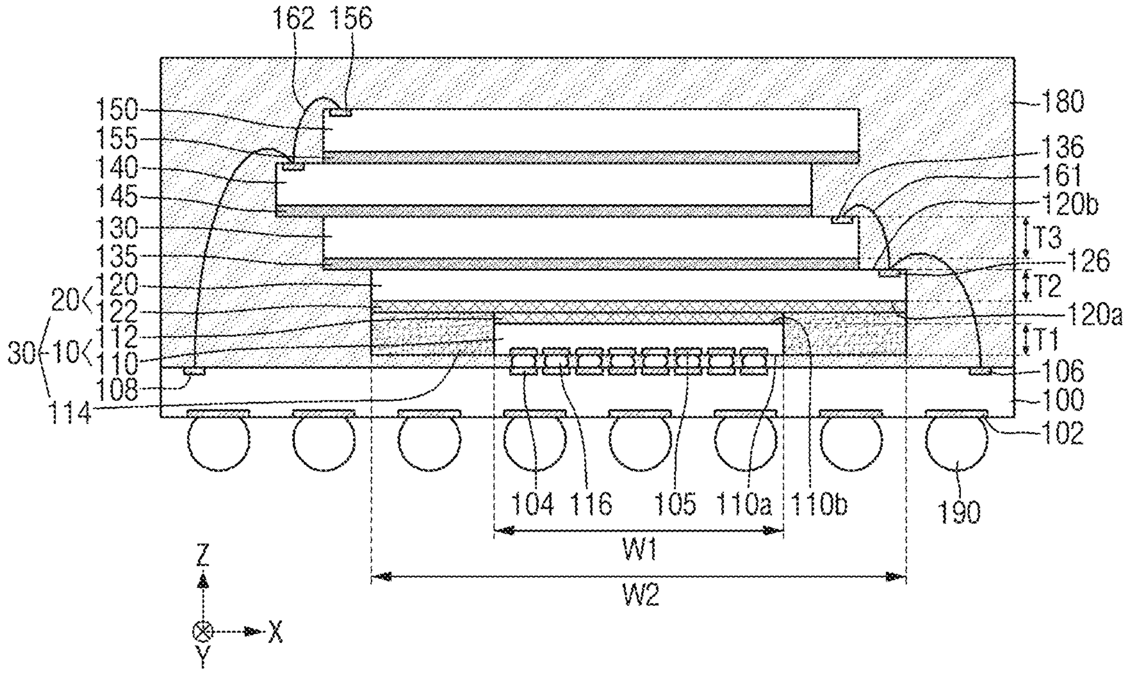
FIG. 2 is a cross-sectional view taken along line I-I of FIG. 1.

FIG. 1 is a plan view illustrating a semiconductor package according to some example embodiments of the present disclosure. FIG. 2 is a cross-sectional view taken along line I-I of FIG. 1.

Referring to FIGS. 1 and 2, a semiconductor package according to some example embodiments may include a substrate 100, external terminals 190, a first chip stack including a chip stack structure 30 and third to fifth semiconductor chips 130, 140, 150, chip connection terminals 116, a first molding layer 114, wires 161, 162, and second mold layer 180.

The substrate 100 may be a substrate for a semiconductor package. The substrate 100 may be, for example, a printed circuit board (PCB), a ceramic substrate, a tape wiring board, or the like. When it is a PCB, the package substrate 100 may be made of at least one material selected from phenol resin, epoxy resin, and polyimide. For example, the substrate 100 may include at least one material selected from FR4, tetrafunctional epoxy, polyphenylene ether, epoxy/polyphenylene oxide, bismaleimide triazine (BT), thermount, cyanate ester, polyimide, and liquid crystal polymer.

The substrate 100 may extend in a first direction X and a second direction Y, respectively. The first direction X and the second direction Y may be parallel to the upper surface of the substrate 100. The second direction Y may intersect the first direction X. A third direction Z may be perpendicular to the upper surface of the substrate 100. The third direction Z may intersect the first direction X and the second direction Y. Here, the upper surface of the substrate 100 and the lower surface of the substrate 100 may be defined based on the third direction Z.

The substrate 100 may include a first substrate pad 102 and second substrate pads 104, 106, 108. The first substrate pad 102 may be disposed and exposed on the lower surface of the substrate 100, and the second substrate pads 104, 106, 108 may be disposed and exposed on the upper surface of the substrate 100. The first substrate pad 102 and the second substrate pads 104, 106, 108 may be electrically interconnected through internal wirings of the substrate 100.

The external terminals 190 may be disposed on the first substrate pad 102. The external terminals 190 may contact the first substrate pad 102. The external terminals 190 may be electrically connected to the first substrate pad 102 and the second substrate pad 104, 106, 108 through internal wirings in the substrate 100. The external terminals 190 may be electrically connected to an external device. Accordingly, external signals may be provided to the substrate 100 through the external terminals 190.

The external terminals 190 may be, for example, solder bumps, a grid array, or conductive tabs. It should be understood that the number, spacing, arrangement, shape, etc. of the external terminals 190 are not limited to those shown, and may vary by design. The external terminals 190 may include, but is not limited to, tin (Sn), indium (In), bismuth (Bi), antimony (Sb), copper (Cu), silver (Ag), zinc (Zn), lead (Pb), and combinations thereof, for example.

The first to fifth semiconductor chips 110, 120, 130, 140, 150 to be described below may each include an integrated circuit. Each of the first to fifth semiconductor chips 110, 120, 130, 140, 150 may include an active surface formed with the integrated circuit and an inactive surface opposite to the active surface. Arranged on the active surfaces may be second to fifth chip pads 126, 136, 146, 156 each configured to apply a signal to each of the first to fifth semiconductor chips 110, 120, 130, 140, 150. The active surface may be referred to as a front side surface, and the inactive surface may be referred to as a backside surface.

The first chip stack may be disposed on the substrate 100. The first chip stack may include a plurality of semiconductor chips 110, 120, 130, 140, 150 stacked in the third direction Z. The first chip stack may include a chip stack structure 30 and third to fifth semiconductor chips 130, 140, and 150. It should be understood that the number, arrangement, etc. of the semiconductor chips included in the first chip stack are not limited to those shown, and may vary by design.

The chip stack structure 30 may include a first chip structure 10, a second chip structure 20, and a first molding layer 114.

The first chip structure 10 may include a first semiconductor chip 110 and a first dielectric layer 112.

The first semiconductor chip 110 may include a first surface 110*a* and a second surface 110*b* that are opposite to each other. The first surface 110*a* may face the upper surface of the substrate 100. The first semiconductor chip 110 may include first chip pads 105. The first chip pads 105 may be disposed and exposed on the first surface 110*a* of the first semiconductor chip 110. Therefore, the first surface 110*a* may be an active surface of the first semiconductor chip 110, while the second surface 110*b* may be an inactive surface of the first semiconductor chip 110.

The first dielectric layer 112 may be disposed on the second surface 110*b* of the first semiconductor chip 110. The first dielectric layer 112 may extend along the second surface 110*b* of the first semiconductor chip 110. The first dielectric layer 112 may contact the second surface 110*b* of the first semiconductor chip 110.

In the first direction X and the second direction Y, the first semiconductor chip 110 may be substantially the same or the same in width as the first dielectric layer 112. For example, the first semiconductor chip 110 and the first dielectric layer 112 may have a first width W1 in the first direction X. Therefore, the first chip structure 10 may have the first width W1 in the first direction X.

The first semiconductor chip 110 may be a logic semiconductor chip. The logic semiconductor chip may be, but is not limited to, an application processor (AP) such as a central processing unit (CPU), a graphic processing unit (GPU), a field-programmable gate array (FPGA), a digital signal processor, a cryptographic processor, a microprocessor, a microcontroller, and an application-specific IC (ASIC), for example.

The second chip structure 20 may include a second semiconductor chip 120 and a second dielectric layer 122.

The second semiconductor chip 120 may include a third surface 120*a* and a fourth surface 120*b* that are opposite to each other. The third surface 120*a* may face the second surface 110*b* of the first semiconductor chip 110. The second chip pad 126 may be disposed and exposed on the fourth surface 120*b* of the second semiconductor chip 120. Therefore, the fourth surface 120*b* may be an active surface of the second semiconductor chip 120, while the third surface 120*a* may be an inactive surface of the second semiconductor chip 120.

The second dielectric layer 122 may be disposed on the third surface 120*a* of the second semiconductor chip 120. The second dielectric layer 122 may extend along the third surface 120*a* of the second semiconductor chip 120. The second dielectric layer 122 may contact the third surface 120*a* of the second semiconductor chip 120.

The first chip structure 10 and the second chip structure 20 may be bonded to each other by the first dielectric layer 112 and the second dielectric layer 122. The second dielectric layer 122 may be disposed on the first dielectric layer 112. The second dielectric layer 122 may contact the first dielectric layer 112. The second dielectric layer 122 may be attached to the first dielectric layer 112. As the second dielectric layer 122 and the first dielectric layer 112 are joined, the first semiconductor chip 110 and the second semiconductor chip 120 may be joined.

The drawing shows that there is an interface to which the first dielectric layer 112 and the second dielectric layer 122 are attached, which is merely exemplary. No interface may exist to which the first dielectric layer 112 and the second dielectric layer 122 are attached.

The first dielectric layer 112 and the second dielectric layer 122 may be bonded by an oxide-to-oxide bonding process. For example, the first dielectric layer 112 and the second dielectric layer 122 may include a dielectric material. The first dielectric layer 112 and the second dielectric layer 122 may each include, for example, silicon oxide. However, this is merely exemplary, and as long as the first dielectric layer 112 and the second dielectric layer 122 are bonded, the material constituting the first dielectric layer 112 and the second dielectric layer 122 is not limited to the dielectric material.

The first dielectric layer 112 and the second dielectric layer 122 do not include metal or internal wiring. Therefore, the bonding of the first and second dielectric layers 112 and 122 by an oxide-to-oxide bonding process may be simpler than, for example, a hybrid bonding process including bonding between two metals that are in contact and bonding between two dielectric bodies that are in contact.

Additionally, the thickness of the semiconductor package may be thinner than when attaching the second semiconductor chip 120 to the first semiconductor chip 110 by using an adhesive layer.

In the first direction X and the second direction Y, the second semiconductor chip 120 may be substantially the same or the same in width as the second dielectric layer 122. For example, the second semiconductor chip 120 and the second dielectric layer 122 may have a second width W2 in the first direction X. Therefore, the second chip structure 20 may have the second width W2 in the first direction X.

In the first direction X and the second direction Y, the first chip structure 10 may be different in width from the second chip structure 20. In the first direction X and the second direction Y, the first chip structure 10 may be smaller in width than the second chip structure 20. For example, the second width W2 may be greater than the first width W1.

The second semiconductor chip 120 may be a different semiconductor chip from the first semiconductor chip 110. The second semiconductor chip 120 may be a memory semiconductor chip. The memory semiconductor chip may be, for example, a volatile memory such as dynamic random access memory (DRAM) or static random access memory (SRAM), or may be a non-volatile memory such as flash memory, phase-change random access memory (PRAM), magnetic random access memory (MRAM), Ferroelectric random access memory (FeRAM), or resistive random access memory (RRAM).

The first molding layer 114 may be disposed on the third surface 120*a* of the second semiconductor chip 120. The first molding layer 114 may be disposed on the second dielectric layer 122. The first molding layer 114 may surround the first chip structure 10. The first molding layer 114 may surround the sidewalls of the first semiconductor chip 110 and sidewalls of the first dielectric layer 112. The first molding layer 114 may contact the second dielectric layer 122. The first molding layer 114 may contact a lower surface of the second dielectric layer 122 and the sidewalls of the first dielectric layer 112.

In the first direction X and the second direction Y, the outer walls of the first molding layer 114 may be substantially coplanar or coplanar with the side walls of the second chip structure 20. For example, the width between the outer walls of the first molding layer 114 in the first direction X may be the same or substantially the same as the width in the first direction X of the second chip structure 20. The width between the outer walls of the first molding layer 114 in the first direction X may be the second width W2. The outer walls of the first molding layer 114 may refer to side walls that do not contact the first semiconductor chip 110.

A lower surface of the first molding layer 114 may face an upper surface of the substrate 100. The first molding layer 114 may expose the first surface 110*a* of the first semiconductor chip 110. The lower surface of the first molding layer 114 may be substantially coplanar or coplanar with the first surface 110*a* of the first semiconductor chip 110. For example, the first chip structure 10 in the third direction Z may be substantially the same or the same in thickness as the first molding layer 114 in the third direction Z.

Since the first molding layer 114 is formed on an overhang portion of the second semiconductor chip 120 above the first semiconductor chip 110, the first molding layer 114 can prevent or reduce the bending of the second semiconductor chip 120. Accordingly, the thickness T2 of the second semiconductor chip 120 may be desirably thinner thanks to the first molding layer 114. For example, the thickness T2 of the second semiconductor chip 120 may be thinner than the thickness T3 of the third semiconductor chip 130.

The first molding layer 114 may include a thermosetting resin, a thermoplastic resin, a UV curable resin, or a combination thereof. The first molding layer 114 may include, for example, an epoxy resin, a silicone resin, or a combination thereof. The first molding layer 114 may include, for example, an epoxy mold compound (EMC).

The second chip structure 20 may be disposed on the first chip structure 10. The second chip structure 20 and the first chip structure 10 may be bonded together by the first dielectric layer 112, the first molding layer 114, and the second dielectric layer 122.

The chip connection terminals 116 may be disposed between the substrate 100 and the chip stack structure 30. The chip connection terminals 116 may be disposed between the second substrate pads 104 of the substrate 100 and the first chip pads 105 of the first semiconductor chip 110. The chip connection terminals 116 may electrically connect the substrate 100 with the first semiconductor chip 110. For example, the first semiconductor chip 110 may be disposed in the form of a flip chip.

The chip connection terminals 116 may be, but is not limited to, bumps, balls, or a combination thereof, for example. It should be understood that the number, spacing, arrangement, shape, etc. of the chip connection terminals 116 are not limited to those shown in the drawings, and may vary by design.

The third to fifth semiconductor chips 130, 140, 150 may be memory semiconductor chips. The third to fifth semiconductor chips 130, 140, 150 may be, for example, the same kind of memory semiconductor chip as the second semiconductor chip 120. In some example embodiments, the third to fifth semiconductor chips 130, 140, 150 may be different kinds of semiconductor chips.

In the third direction Z, the thickness T3 of the third semiconductor chip 130 may be different from the thickness T2 of the second semiconductor chip 120. The thickness T3 of the third semiconductor chip 130 may be greater than the thickness T2 of the second semiconductor chip 120. The thickness T3 of the third semiconductor chip 130 may be different from the thickness T1 of the first semiconductor chip 110. The thickness T3 of the third semiconductor chip 130 may be greater than the thickness T1 of the first semiconductor chip 110. The thickness of the fourth and fifth semiconductor chips 140 and 150 may be substantially the same or the same as the thickness T3 of the third semiconductor chip 130.

Each of the second to fifth chip pads 126, 136, 146, 156 may be disposed on an upper surface of each of the second to fifth semiconductor chips 120, 130, 140, 150. Each of the second to fifth chip pads 126, 136, 146, 156 may be formed in plurality. Each of the second to fifth chip pads 126, 136, 146, 156 may include, for example, at least one metal of copper (Cu), aluminum (Al), tungsten (W), and titanium (Ti). The number, spacing, arrangement, etc. of the second to fifth chip pads 126, 136, 146, 156 are not limited to those shown in the drawings and may vary by design.

Positioned on a lower surface of each of the third to fifth semiconductor chips 130, 140, 150 may be each of first to third adhesive layers 135, 145, 155. The first adhesive layer 135 may be disposed between the second semiconductor chip 120 and the third semiconductor chip 130, the second adhesive layer 145 may be disposed between the third semiconductor chip 130 and the fourth semiconductor chip 140, and the third adhesive layer 155 may be disposed between the fourth semiconductor chip 140 and the fifth semiconductor chip 150. The third to fifth semiconductor chips 130, 140, 150 may be attached by the first to third adhesive layers 135, 145, 155 to the second to fourth semiconductor chips 120, 130, 140, respectively. In the first direction X and the second direction Y, each of the first to third adhesive layers 135, 145, 155 may be the same or substantially the same in width as each of the third to fifth semiconductor chips 130, 140, 150.

The first to third adhesive layers 135, 145, 155 may include, respectively, for example, underfill, adhesive film, direct adhesive film (DAF), film over wire (FOW), or their combinations.

The chip stack structure 30 and the third to fifth semiconductor chips 130, 140, and 150 may be stacked stepwise (e.g., terraced, or having misaligned centers in a first direction and/or a second direction while being stacked on one another). For example, the second to fifth semiconductor chips 120, 130, 140, and 150 may be stacked stepwise. The chip stack structure 30 and the third and fourth semiconductor chips 130 and 140 may be configured as descending stepped stacks in the first direction X. The fourth and fifth semiconductor chips 140 and 150 may be configured as ascending stepped stacks in the first direction X. Accordingly, each of the second to fifth chip pads 126, 136, 146, and 156 may be exposed on the top surface of each of the second to fifth semiconductor chips 120, 130, 140, 150, and the top surface of each of the second to fifth semiconductor chips 120, 130, 140, 150 may be active surface.

The wire 161 may interconnect the second and third chip pads 126 and 136 and the second substrate pad 106 of the substrate 100, and the wire 162 may interconnect the fourth and fifth chip pads 146 and 156 and the second substrate pad at 108. Accordingly, each of the second to fifth semiconductor chips 120, 130, 140, 150 may be electrically connected to the substrate 100 through wires 161 and 162. The first semiconductor chip 110 may be electrically connected through the substrate 100 with the second to fifth semiconductor chips 120, 130, 140, 150. The number, arrangement, interconnections, etc. of the wires 161 and 162 are not limited to those shown in the drawings and may vary by design.

The wires 161 and 162 may be made of, for example, gold (Au), copper (Cu), silver (Ag), aluminum (Al), or a combination thereof.

Arranged on the upper surface of the substrate 100 may be a second mold layer 180. The second mold layer 180 may cover the chip stack structure 30 and the third to fifth semiconductor chips 130, 140, 150. For example, the second mold layer 180 may cover the upper surface of the fifth semiconductor chip 150, but is not limited thereto.

The second mold layer 180 may include a thermosetting resin, a thermoplastic resin, a UV curable resin, or a combination thereof. The second mold layer 180 may include, for example, an epoxy resin, a silicone resin, or a combination thereof. The second mold layer 180 may include, for example, an epoxy mold compound (EMC).

Figure 3:
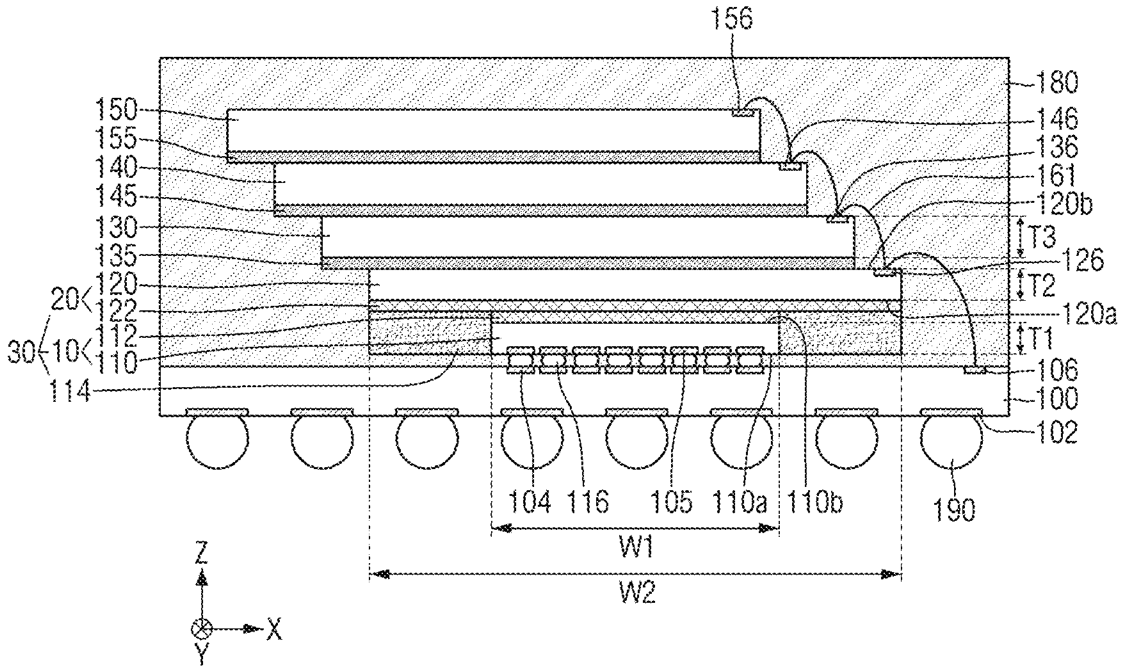
FIG. 3 is a diagram for explaining a semiconductor package according to some example embodiments.

FIG. 3 is a diagram for explaining a semiconductor package according to some example embodiments. For reference, FIG. 3 is a cross-sectional view taken along line I-I of FIG. 1. For the convenience of description, the following concentrates on the differences from those described with reference to FIGS. 1 and 2.

Referring to FIG. 3, in a semiconductor package according to some example embodiments, the chip stack structure 30 and the third to fifth semiconductor chips 130, 140, 150 may be configured as a descending stepped structure in the first direction X. The wire 161 may connect the second to fifth chip pads 126, 136, 146, 156 to the second substrate pad 106 of the substrate 100.

Figure 4:
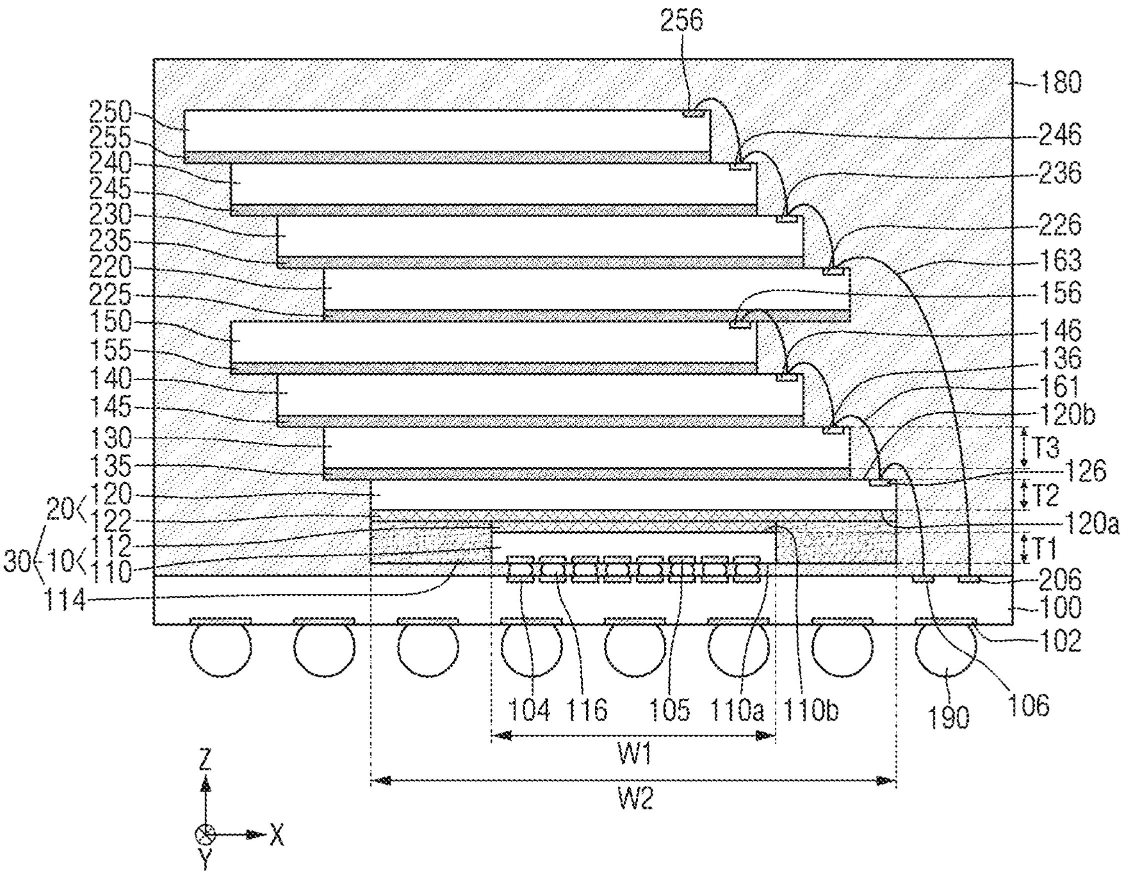
FIG. 4 is a diagram for explaining a semiconductor package according to some example embodiments.

FIG. 4 is a view for explaining a semiconductor package according to some example embodiments. For reference, FIG. 4 is a cross-sectional view taken along line I-I of FIG. 1. For the convenience of description, the following concentrates on the differences from those described with reference to FIGS. 1 to 3.

Referring to FIG. 4, a semiconductor package according to some example embodiments may include first chip stack and second chip stack.

The second chip stack may be disposed on the first chip stack. The second chip stack may include sixth to ninth semiconductor chips 220, 230, 240, 250 stacked in the third direction Z. The sixth to ninth semiconductor chips 220, 230, 240, 250 may be memory semiconductor chips. The sixth to ninth semiconductor chips 220, 230, 240, 250 may be, for example, the same kind of memory semiconductor chip as the second semiconductor chip 120. In some example embodiments, the sixth to ninth semiconductor chips 220, 230, 240, 250 may be different kinds of semiconductor chips. The number, arrangement, etc. of the semiconductor chips included in the second chip stack are not limited thereto and may vary by design.

Each of the sixth to ninth chip pads 226, 236, 246, 256 may be disposed on the top surface of each of the sixth to ninth semiconductor chips 220, 230, 240, 250. Each of the sixth to ninth semiconductor chips 220, 230, 240, 250 may be formed in plurality. Each of the sixth to ninth chip pads 226, 236, 246 256 may include, for example, at least one of copper (Cu), aluminum (Al), tungsten (W), and titanium (Ti). The number, spacing, arrangement, etc. of the sixth to ninth chip pads 226, 236, 246, 256 are not limited to those shown in the drawings and may vary by design.

Each of the fourth to seventh adhesive layers 225, 235, 245, 255 may be disposed on a lower surface of each of the sixth to ninth semiconductor chips 220, 230, 240, 250. The fourth adhesive layer 225 may be disposed between the fifth semiconductor chip 150 and the sixth semiconductor chip 220, the fifth adhesive layer 235 may be disposed between the sixth semiconductor chip 220 and the seventh semiconductor chip 230, the sixth adhesive layer 245 may be disposed between the seventh semiconductor chip 230 and the eighth semiconductor chip 240, and the seventh adhesive layer 255 may be disposed between the eighth semiconductor chip 240 and the ninth semiconductor chip 250. Each of the sixth to ninth semiconductor chips 220, 230, 240, 250 may be attached by each of the fourth to seventh adhesive layers 225, 235, 245, 255 to each of the fifth to eighth semiconductor chips 150, 220, 230, 240. In the first direction X and the second direction Y, the fourth to seventh adhesive layers 225, 235, 245, 255 may be the same or substantially the same in width as the sixth to ninth semiconductor chips 220, 230, 240 250, respectively.

The fourth to seventh adhesive layers 225, 235, 245, 255 may each include, for example, underfill, adhesive film, direct adhesive film (DAF), film over wire (FOW), or combinations thereof.

The second chip stack may be stacked stepwise. The sixth to ninth semiconductor chips 220, 230, 240, 250 may be configured as descending stepped stacks in the first direction X. Accordingly, each of the sixth to ninth chip pads 226, 236, 246, 256 may be exposed on the top surface of each of the sixth to ninth semiconductor chips 220, 230, 240, 250, wherein the sixth to ninth semiconductor chips 220, 230, 240, 250 may have active top surfaces, respectively.

The wire 163 may connect the sixth to ninth chip pads 226, 236, 246, 256 with the second substrate pad 206 of the substrate 100. The first semiconductor chip 110 and the sixth to ninth semiconductor chips 220, 230, 240, 250 may be electrically interconnected through the substrate 100. The number, arrangement, interconnections, etc. of the wires 161 and 163 are not limited to those shown in the drawings and may vary by design.

Figure 5:
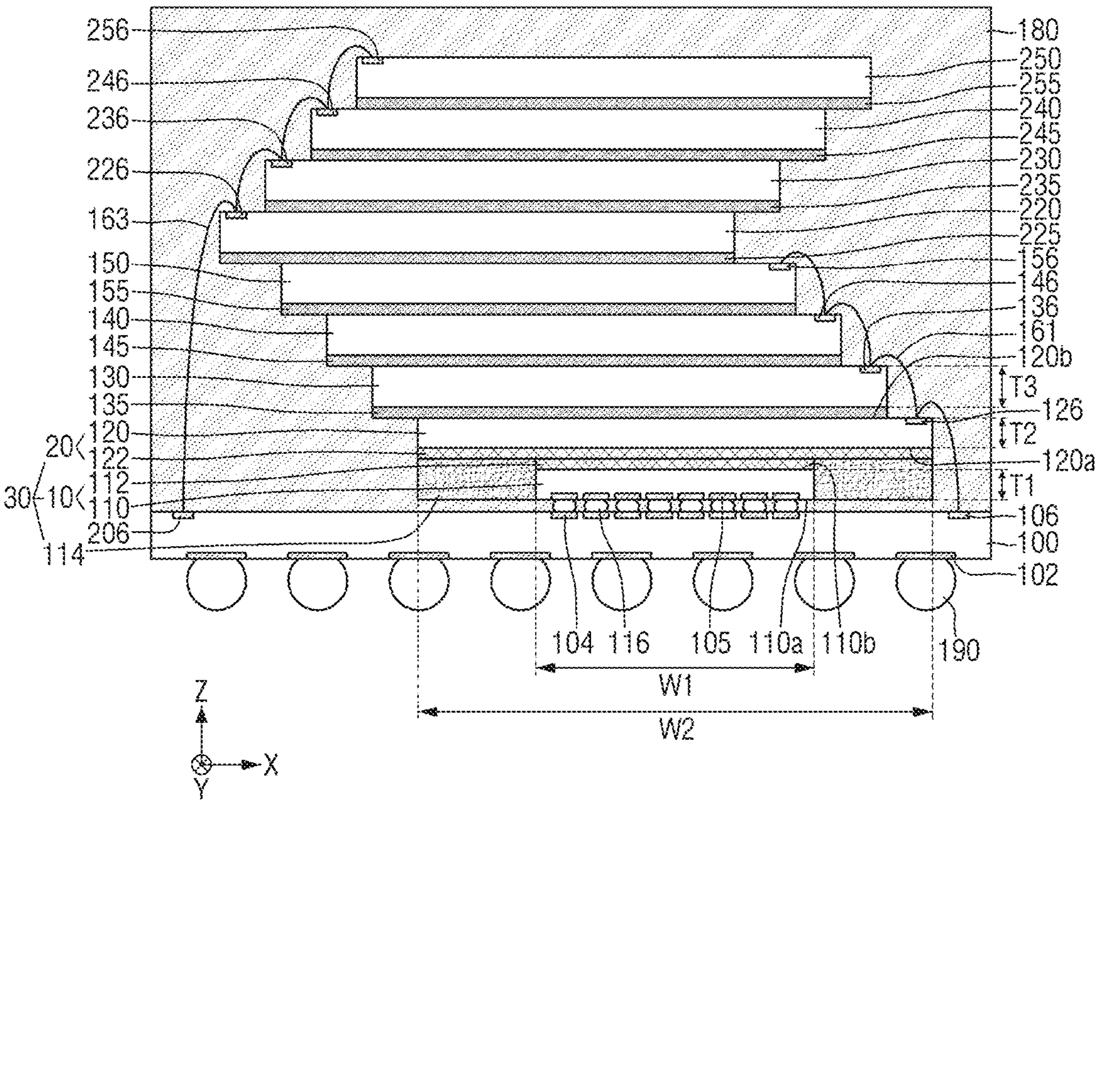
FIGS. 5 and 6 are diagrams for explaining a semiconductor package according to some example embodiments.
Figure 6:
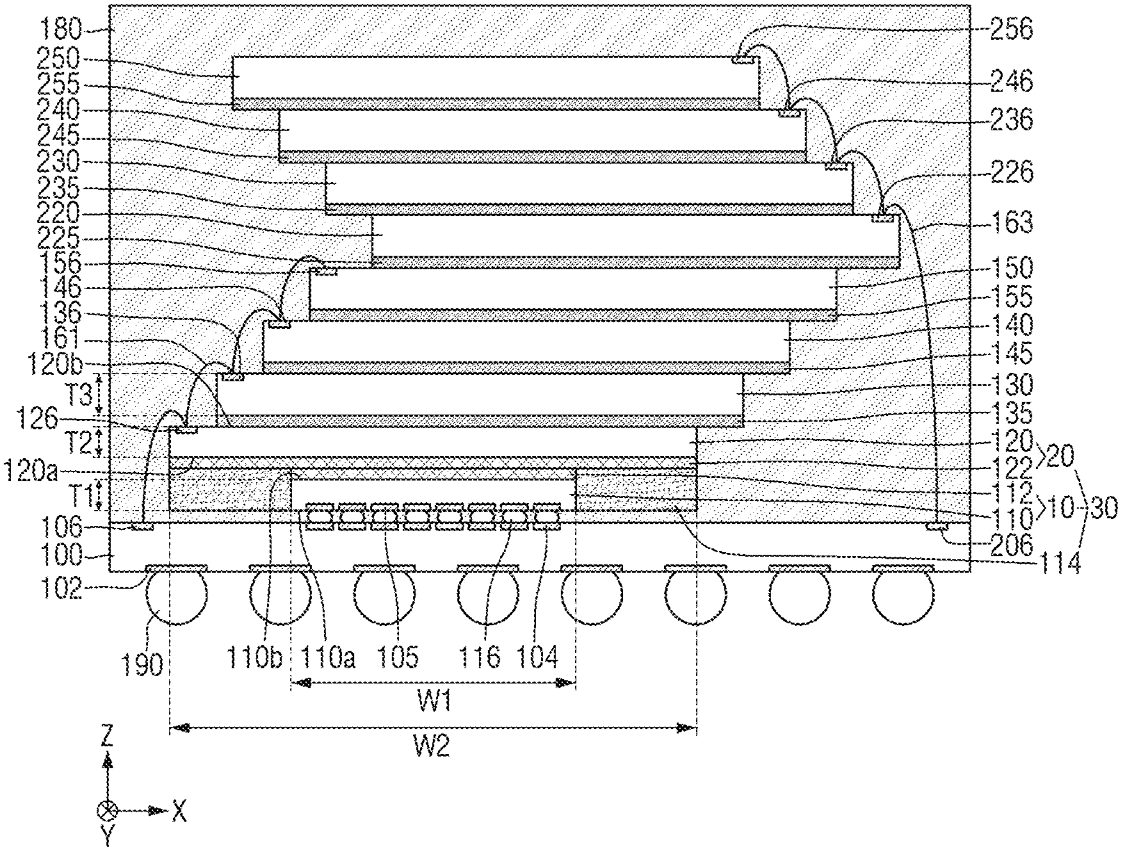

FIGS. 5 and 6 are diagrams for explaining a semiconductor package according to some example embodiments. For reference, FIG. 5 is a cross-sectional view taken along line I-I of FIG. 1. For the convenience of description, the following concentrates on the differences from those described with reference to FIGS. 1 to 4.

Referring to FIG. 5, the sixth to ninth semiconductor chips 220, 230, 240, 250 may be configured as ascending stepped stacks in the first direction X.

Referring to FIG. 6, the chip stack structure 30 and the third to fifth semiconductor chips 130, 140, 150 may be configured as ascending stepped stacks in the first direction X. The sixth to ninth semiconductor chips 220, 230, 240, 250 may be configured as descending stepped stacks in the first direction X.

FIGS. 7 to 15 illustrate intermediate steps of a method of manufacturing a semiconductor package according to some example embodiments. For convenience of description, the following concentrates on the differences from those described with reference to FIGS. 1 to 6.

Figure 7:
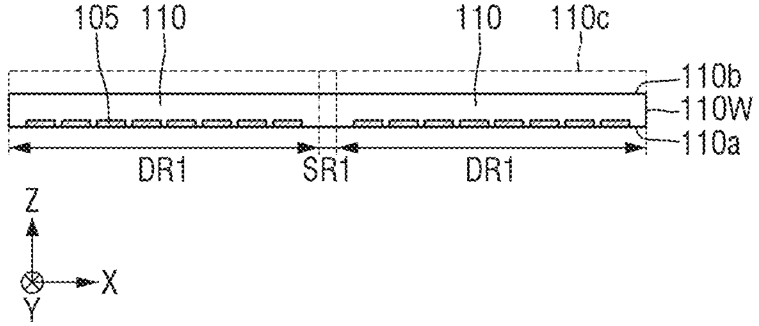
FIGS. 7 to 15 illustrate intermediate steps of a method of manufacturing a semiconductor package according to some example embodiments.

Referring to FIG. 7, a first wafer 110W may be provided. The first wafer 110W may be a semiconductor wafer. For example, the first wafer 110W may be a silicon (Si) substrate, a germanium (Ge) substrate, or a silicon-germanium (Si—Ge) substrate.

The first wafer 110W may include a first surface 110*a* and a fifth surface 110*c* that are opposite to each other. The first wafer 110W may include at least one first device region DR1 and a first scribe region SR1 spaced apart in one direction and defining the first device region DR1. The first device region DR1 of the first wafer 110W may be a region in which the first semiconductor chip 110 is formed. The first scribe region SR1 of the first wafer 110W may be a region in which a sawing process is performed to singulate the first semiconductor chip 110 in a process to be described below.

The first semiconductor chip 110 may be formed in the first device region DR1 of the first wafer 110W. The first semiconductor chip 110 may be formed on the first surface 110*a* of the first wafer 110W. The integrated circuit of the first semiconductor chip 110 may be formed on the first surface 110*a* of the first wafer 110W, and the first semiconductor chip 110 may have the first chip pads 105 formed on the first surface 110*a* of the first wafer 110W. Therefore, the first surface 110*a* of the first wafer 110W may be an active surface, while the fifth surface 110*c* may be an inactive surface.

Subsequently, the fifth surface 110*c* of the first wafer 110W may undergo a grinding process. In other words, the inactive surface of the first wafer 110W may be ground. The first wafer 110W may include the first surface 110*a* and a second surface 110*b* that are opposite to each other. This may provide the first wafer 110W with multiple first semiconductor chips 110.

Figure 8:
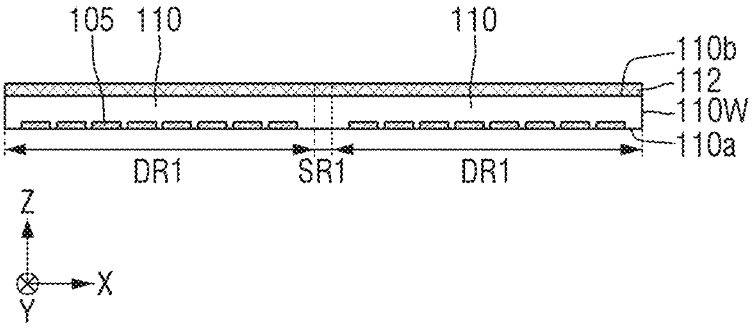

Referring to FIG. 8, a first dielectric layer 112 may be formed on the first wafer 110W. The first dielectric layer 112 may be formed on the second surface 110*b* of the first wafer 110W. The first dielectric layer 112 may extend along the second surface 110*b* of the first wafer 110W.

Figure 9:
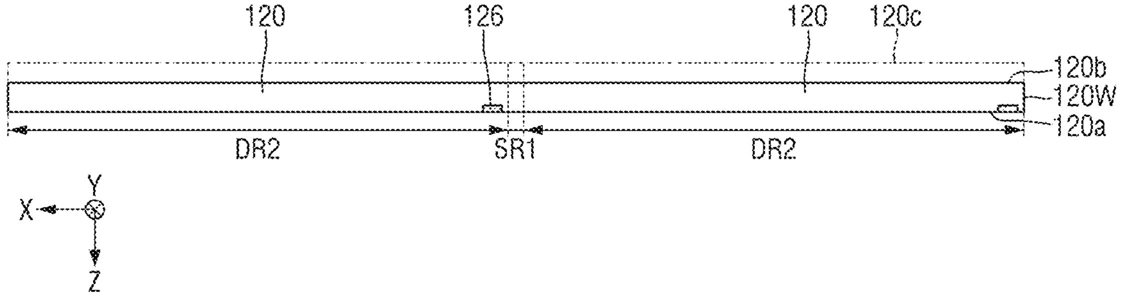

Referring to FIG. 9, a second wafer 120W may be provided. The second wafer 120W may be a semiconductor wafer. For example, the second wafer 120W may be a silicon (Si) substrate, a germanium (Ge) substrate, or a silicon-germanium (Si—Ge) substrate. The second wafer 120W may include a third surface 120*a* and a sixth surface 120*c* that are opposite to each other.

The second wafer 120W may include at least one second device region DR2 and a second scribe region SR2 spaced apart in one direction and defining the second device region DR2. The second device region DR2 of the second wafer 120W may be a region in which the second semiconductor chip 120 is formed. The second scribe region SR2 of the second wafer 120W may be a region in which a sawing process is performed to singulate the second semiconductor chip 120 in a process to be described below.

The second semiconductor chip 120 may be formed in the second device region DR2 of the second wafer 120W. The second semiconductor chip 120 may be formed on the third surface 120*a* of the second wafer 120W. The integrated circuit of the second semiconductor chip 120 may be formed on the third surface 120*a* of the second wafer 120W, and the second semiconductor chip 120 may have a second chip pad 126 formed on the third surface 120*a* of the second wafer 120W. Therefore, the third surface 120*a* of the second wafer 120W may be an active surface, while the sixth surface 120*c* may be an inactive surface. This may provide the second wafer 120W including multiple second semiconductor chips 120.

Subsequently, the sixth surface 120*c* of the second wafer 120W may undergo a grinding process. In other words, the inactive surface of the second wafer 120W may be ground. The second wafer 120W may include the third surface 120*a* and a fourth surface 120*b* that are opposite to each other. Under this condition, the second wafer 120W may be provided with multiple second semiconductor chips 120.

Figure 10:
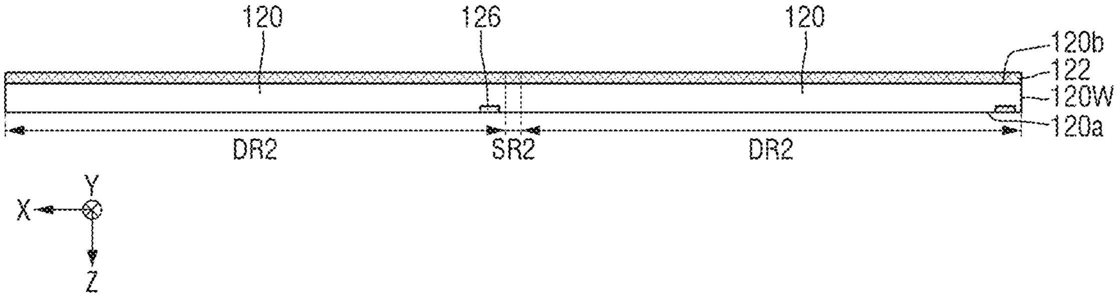

Referring to FIG. 10, a second dielectric layer 122 may be formed on the second wafer 120W. The second dielectric layer 122 may be formed on the third surface 120*a* of the second wafer 120W. The first dielectric layer 112 may extend along the third surface 120*a* of the second wafer 120W.

Figure 11:
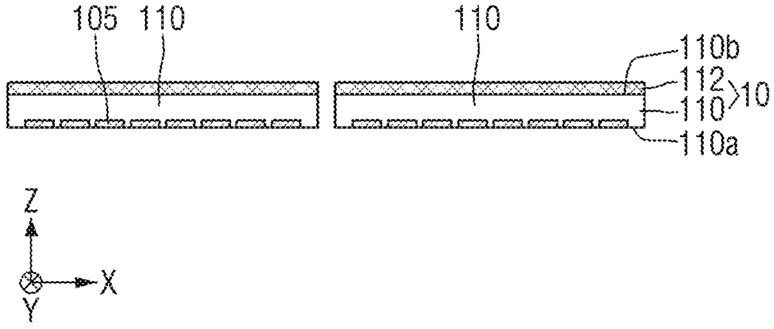

One may rearrange the manufacturing methods to perform the method described in FIG. 8 following the method described in FIG. 7, perform the method described in FIG. 11 following the method described in FIG. 8, and perform the method described in FIG. 10 following the method described in FIG. 9 and thereby vary the order of the manufacturing methods described using FIGS. 8 to 11.

Referring to FIG. 11, the first wafer 110W formed with the first dielectric layer 112 may be singulated. The first dielectric layer 112 and the first wafer 110W may be sawed along the first scribe region SR1 to form a first chip structure 10 including the first dielectric layer 112 and the first semiconductor chip 110.

Figure 12:
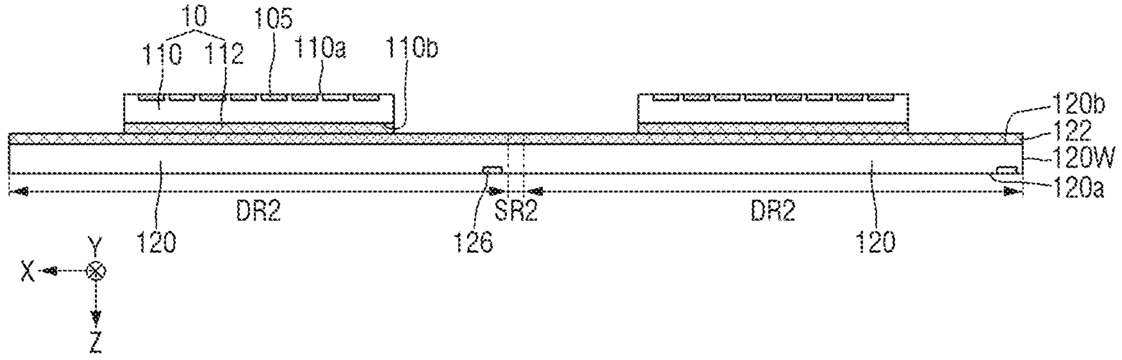

Referring to FIG. 12, the first chip structure 10 may be bonded to the second wafer 120W formed with the second dielectric layer 122. The first chip structure 10 may be bonded with the first dielectric layer 112 facing the second dielectric layer 122. The first chip structure 10 may be attached to the second wafer 120W by the first dielectric layer 112 and the second dielectric layer 122.

Figure 13:
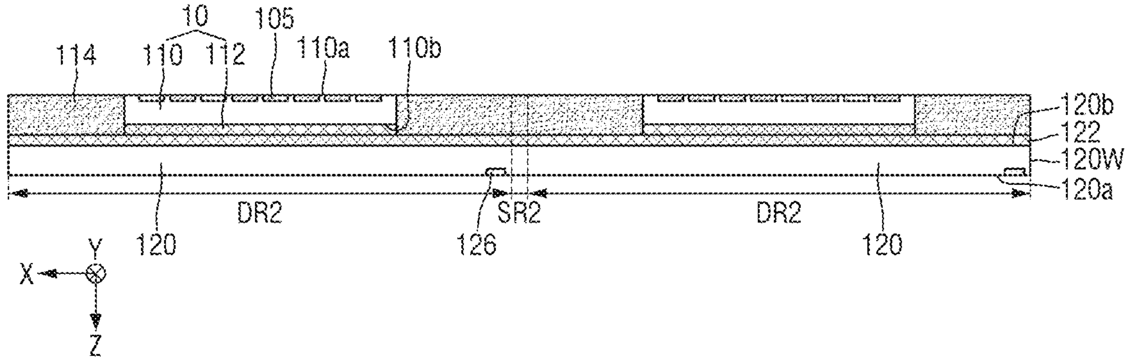

Referring to FIG. 13, a first molding layer 114 may be formed on the second dielectric layer 122. The first molding layer 114 may be attached to the second dielectric layer 122. The first molding layer 114 may surround the first chip structure 10. The first molding layer 114 may fill spaces between the first chip structures 10 spaced apart from each other. The first molding layer 114 may be attached to the sidewalls of the first chip structure 10. The first molding layer 114 may expose the first surface 110*a* of the first semiconductor chip 110. The first molding layer 114 that is now turned over may have its lower surface of the first molding layer 114(e.g., in the third direction(Z)) to be coplanar with the first surface 110*a* of the first semiconductor chip 110.

Figure 14:
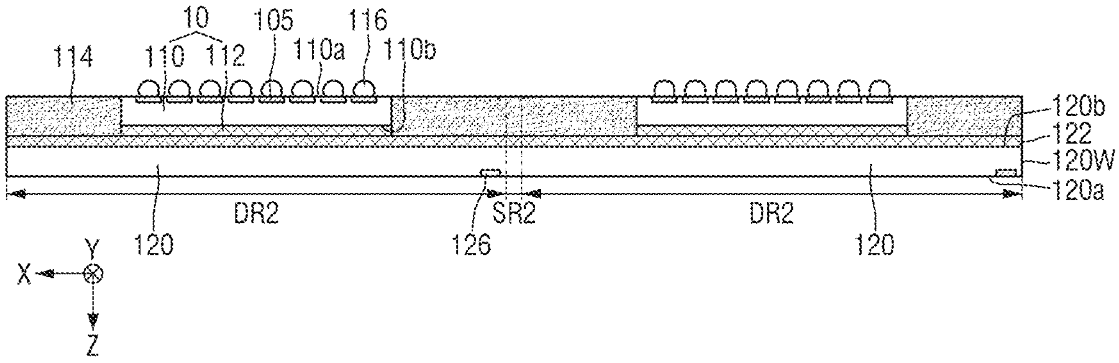

Referring to FIG. 14, chip connection terminals 116 may be formed on the first surface 110*a* of the first semiconductor chip 110. The chip connection terminals 116 may be formed on the first chip pads 105 of the first semiconductor chip 110. The chip connection terminals 116 may contact the first chip pads 105.

Figure 15:
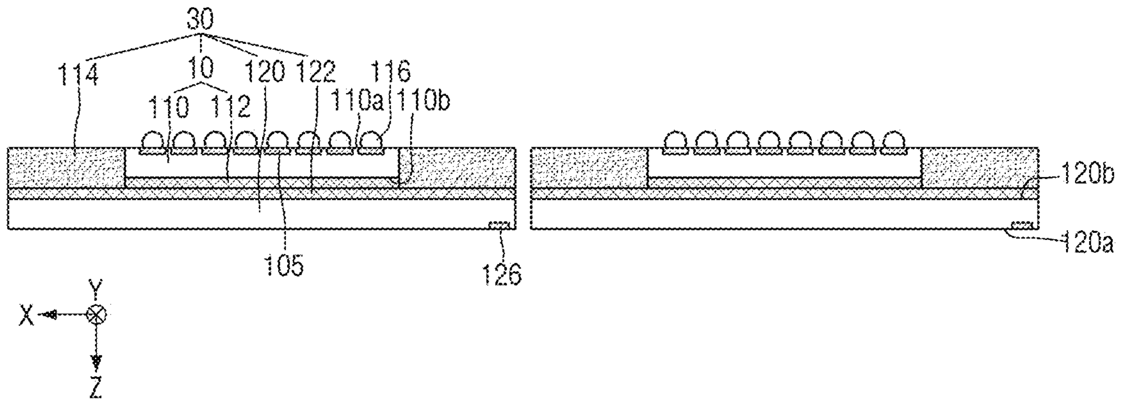

Referring to FIG. 15, the subsequent process may singulate the second wafer 120W formed with the second dielectric layer 122, the first chip structure 10, the first molding layer 114 and the chip connection terminals 116. Along the second scribe region SR2, the first molding layer 114, the second dielectric layer 122, and the second wafer 120W may be sawed to form the chip stack structure 30. The chip stack structure 30 may include a first chip structure 10 including a first semiconductor chip 110 and a first dielectric layer 112, a second chip structure 20 including the second semiconductor chip 120 and the second dielectric layer 122, and the first molding layer 114.

Referring to FIG. 2, the chip stack structure 30 may be mounted on the upper surface of the substrate 100. In particular, the first semiconductor chip 110 and the second semiconductor chip 120 may be treated as a single chip stack structure 30 and mounted at once on the upper surface of the substrate 100.

Accordingly, the first semiconductor chip 110 when treated as the chip stack structure 30 may be made to be advantageously thinner than when processing the first semiconductor chip 110 alone. Additionally, with the first molding layer 114 formed on an overhang of the second semiconductor chip 120 on the first semiconductor chip 110, the second semiconductor chip 120 may be made to be thinner than when processing the second semiconductor chip 120 alone. This reduces the overall thickness of the semiconductor package.

When the term "substantially" is used in connection with geometric shapes and features, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While a few exemplary embodiments of the present disclosure have been described with reference to the accompanying drawings, this disclosure may be made in different forms and those skilled in the art will readily appreciate that various changes in form and details may be made therein without departing from the technical idea and scope of the present disclosure as defined by the following claims. Therefore, it is to be understood that the foregoing is illustrative of the present disclosure in all respects and is not to be construed as limited to the specific exemplary embodiments disclosed.

The invention claimed is:

1. A semiconductor package comprising:
- a first semiconductor chip including a first surface and a second surface that are opposite to each other;
- connection terminals on the first surface of the first semiconductor chip;
- a first dielectric layer on the second surface of the first semiconductor chip, the first dielectric layer having a same width as the first semiconductor chip;
- a second semiconductor chip on the first dielectric layer and including a third surface opposite to the second surface and a fourth surface opposite to the third surface;
- a second dielectric layer on the third surface of the second semiconductor chip and in contact with the first dielectric layer;
- a third semiconductor chip on the fourth surface of the second semiconductor chip; and
- a first adhesive layer between the second semiconductor chip and the third semiconductor chip,
- the first dielectric layer and the second dielectric layer including no wirings.

2. The semiconductor package of claim 1, wherein
- the first surface of the first semiconductor chip is an active surface of the first semiconductor chip,
- the fourth surface of the second semiconductor chip is an active surface of the second semiconductor chip, and
- the third semiconductor chip has an active surface opposite to the first adhesive layer on the third semiconductor chip.

3. The semiconductor package of claim 1, further comprising:
- on the second dielectric layer, a molding layer surrounding the first semiconductor chip and the first dielectric layer,
- wherein the molding layer is in contact with the second dielectric layer.

4. The semiconductor package of claim 3, wherein
- the molding layer has outer walls,
- the second dielectric layer has sidewalls which are coplanar with the outer walls of the molding layer, and
- the second semiconductor chip has sidewalls which are coplanar with the outer walls of the molding layer.

5. The semiconductor package of claim 1, wherein the first semiconductor chip is smaller in width than the second semiconductor chip.

6. The semiconductor package of claim 1, wherein the second semiconductor chip is smaller in thickness than the third semiconductor chip.

7. The semiconductor package of claim 1, further comprising:
- a plurality of semiconductor chips on the third semiconductor chip and attached by a second adhesive layer,
- wherein the second semiconductor chip, the third semiconductor chip, and the plurality of semiconductor chips form a terraced stack.

8. The semiconductor package of claim 7, wherein a first plurality of semiconductor chips among the second semiconductor chip, the third semiconductor chip, and the plurality of semiconductor chips, form ascending stepped stacks in a first direction adjacent to the third semiconductor chip, while a second plurality of semiconductor chips not included in the first plurality of semiconductor chips form descending stepped stacks in the first direction.

9. The semiconductor package of claim 1, further comprising:
- a substrate; and
- a wire configured to connect the second semiconductor chip and the third semiconductor chip with the substrate,
- wherein the first semiconductor chip is on the substrate, and the connection terminals are between the first semiconductor chip and the substrate.

10. A semiconductor package, comprising:

a first chip structure including a first semiconductor chip and a first dielectric layer on the first semiconductor chip, the first chip structure having a first width;

a second chip structure including a second semiconductor chip and a second dielectric layer on the second semiconductor chip, the second chip structure having a second width greater than the first width; and a molding layer on the second chip structure and surrounding the first chip structure, the first dielectric layer being in contact with the second dielectric layer, and the molding layer having outer walls coplanar with sidewalls of the first-second chip structure.

11. The semiconductor package of claim 10, wherein the first semiconductor chip comprises a logic semiconductor chip, and the second semiconductor chip comprises a memory semiconductor chip.

12. The semiconductor package of claim 10, wherein the first semiconductor chip includes a first surface and a second surface opposite to the first surface with the first dielectric layer on the second surface, the second semiconductor chip includes a third surface and a fourth surface opposite to the third surface with the second dielectric layer on the third surface, and the semiconductor package further comprises, a first chip pad on the first surface of the first semiconductor chip; and a second chip pad on the fourth surface of the second semiconductor chip.

13. The semiconductor package of claim 10, further comprising:

a substrate;

connection terminals between the first semiconductor chip and the substrate; and a wire configured to connect the second semiconductor chip with the substrate.

14. The semiconductor package of claim 10, further comprising:

a third semiconductor chip and an adhesive layer on the third semiconductor chip, the adhesive layer being between the third semiconductor chip and the second semiconductor chip.

15. The semiconductor package of claim 14, wherein the third semiconductor chip has a third width greater than the first width of the first chip structure.

* * * * *